United States Patent
Beach

(10) Patent No.: US 9,640,649 B2
(45) Date of Patent: May 2, 2017

(54) III-NITRIDE POWER SEMICONDUCTOR WITH A FIELD RELAXATION FEATURE

(75) Inventor: Robert Beach, Altadena, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 1240 days.

(21) Appl. No.: 11/322,923

(22) Filed: Dec. 30, 2005

(65) Prior Publication Data

US 2006/0145189 A1   Jul. 6, 2006

Related U.S. Application Data

(60) Provisional application No. 60/640,378, filed on Dec. 30, 2004.

(51) Int. Cl.
| | | |
|---|---|---|
| H01L 29/778 | (2006.01) | |
| H01L 29/40 | (2006.01) | |
| H01L 29/417 | (2006.01) | |
| H01L 29/423 | (2006.01) | |
| H01L 29/20 | (2006.01) | |

(52) U.S. Cl.
CPC ........ H01L 29/7787 (2013.01); H01L 29/405 (2013.01); H01L 29/41725 (2013.01); H01L 29/42316 (2013.01); *H01L 29/2003* (2013.01)

(58) Field of Classification Search
CPC ............... H01L 29/7787; H01L 29/404; H01L 29/42376
USPC .......................................... 257/192, 194, 195
See application file for complete search history.

(56) References Cited

U.S. PATENT DOCUMENTS

| | | | |
|---|---|---|---|
| 4,190,467 A | | 2/1980 | Lien |
| 5,399,886 A | * | 3/1995 | Hasegawa ...................... 257/192 |
| 5,585,741 A | * | 12/1996 | Jordan ............................ 326/30 |
| 5,629,552 A | * | 5/1997 | Zommer ....................... 257/490 |
| 5,923,072 A | * | 7/1999 | Wada et al. .................... 257/473 |
| 6,100,571 A | | 8/2000 | Mizuta |
| 6,870,201 B1 | | 3/2005 | Deboy et al. |
| 2002/0066908 A1 | | 6/2002 | Smith |
| 2002/0079521 A1 | * | 6/2002 | Lin ................................ 257/288 |
| 2002/0167023 A1 | * | 11/2002 | Chavarkar et al. ........... 257/194 |
| 2003/0141512 A1 | | 7/2003 | Bruderl et al. |
| 2004/0061129 A1 | * | 4/2004 | Saxler et al. ................. 257/192 |
| 2005/0048745 A1 | | 3/2005 | Todd |
| 2005/0051796 A1 | * | 3/2005 | Parikh et al. ................. 257/192 |
| 2005/0194612 A1 | | 9/2005 | Beach |
| 2005/0253168 A1 | | 11/2005 | Wu |
| 2005/0274977 A1 | * | 12/2005 | Saito et al. .................... 257/192 |
| 2006/0108606 A1 | * | 5/2006 | Saxler .................. H01L 21/318 257/200 |

FOREIGN PATENT DOCUMENTS

| | | |
|---|---|---|
| JP | 2001-057426 | 2/2001 |
| JP | 2001-230407 | 8/2001 |

(Continued)

OTHER PUBLICATIONS

Search Report issued in PCT Application Serial No. PCT/US2007/00283 dated Oct. 2, 2007.

*Primary Examiner* — Thomas L Dickey

(74) *Attorney, Agent, or Firm* — Murphy, Bilak & Homiller, PLLC

(57) ABSTRACT

A III-nitride power semiconductor device that includes a field relaxation feature to relax the electric fields around the gate thereof to improve the breakdown voltage of the device.

23 Claims, 7 Drawing Sheets

(56) References Cited

FOREIGN PATENT DOCUMENTS

| JP | 2002-100640 | 4/2002 |
|----|-------------|--------|
| JP | 2004-517461 | 6/2004 |
| WO | WO 2005/079370 | 9/2005 |

* cited by examiner

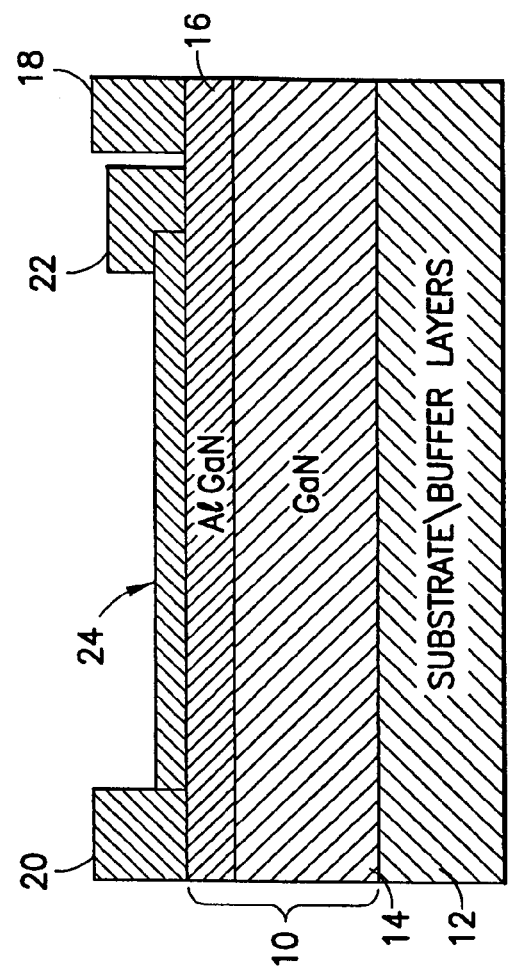
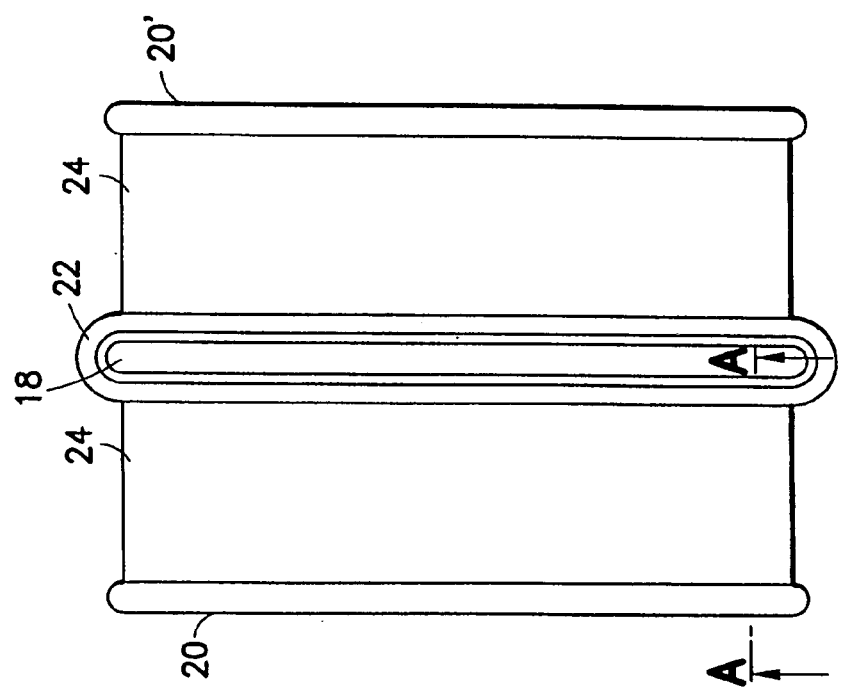
FIG.2
FIG.1

III-NITRIDE POWER SEMICONDUCTOR WITH A FIELD RELAXATION FEATURE

RELATED APPLICATION

This application is based on and claims benefit of U.S. Provisional Application Ser. No. 60/640,378, filed on Dec. 30, 2004, entitled Ultra Resistive Field Plate, to which a claim of priority is hereby made and the disclosure of which is incorporated by reference.

BACKGROUND OF THE INVENTION

The present invention relates to a III-nitride heterojunction power semiconductor device.

III-nitride heterojunction power devices are well known. A typical III-nitride power semiconductor device includes a drain electrode, a source electrode and a gate electrode disposed between the drain electrode and the source electrode. The gate electrode controls the current between the source electrode and the drain electrode. To control the current in a high power application, a large negative voltage is applied to the gate electrode in order to change the voltage at the gate electrode rapidly. When a large voltage is applied to the gate electrode rapidly, a high voltage develops between the gate electrode and the drain electrode. The gate may be damaged if the voltage between the gate and the drain electrode exceeds the breakdown voltage of the gate.

The breakdown of the gate is facilitated by the development of large electric fields around the gate. Thus, it is desirable to reduce the intensity of the electric fields around the gate in order to increase the breakdown voltage of the device.

SUMMARY OF THE INVENTION

A power semiconductor device according to the present invention includes a III-nitride based heterojunction, the heterojunction including a first III-nitride layer having a first band gap, and a second III-nitride layer having another band gap over the first III-nitride layer, a first power electrode electrically connected to the second III-nitride layer, a second power electrode electrically connected to the second III-nitride layer, a gate structure disposed between the first power electrode and the second power electrode, and a field relaxation feature disposed over the second III-nitride layer adjacent the gate structure.

In one embodiment of the present invention the field relaxation feature includes an ultra resistive field plate.

In an alternative embodiment, the field plate is disposed over the second III-nitride layer. In one variation of this embodiment, the gate structure is disposed on the field plate and the second III-nitride layer. In another variation, the gate structure is disposed on the field plate. The field plate may formed with a silicon rich SiN, or a compensated III-nitride semiconductor.

In another embodiment, a plurality of floating field rings may be disposed around the gate structure. In a variation of this embodiment the floating field rings may be disposed over the field plate. The guard rings may be coplanar with one another or non-coplanar, and also the guard rings may be coplanar with the gate structure or not. In addition, the guard rings may be independently floating, shorted to one another, shorted to the gate structure, or shorted to one of the power electrodes.

Other features, embodiments and advantages of the present invention will become apparent from the following description of the invention which refers to the accompanying drawings.

BRIEF DESCRIPTION OF THE DRAWINGS

FIG. 1 shows a top plan view of two adjacently disposed active cells of a device according to the first embodiment of the present invention.

FIG. 2 shows a cross-sectional view of a device according to the first embodiment along line A-A viewed in the direction of the arrows.

DETAILED DESCRIPTION OF THE EMBODIMENTS

Figure 4:
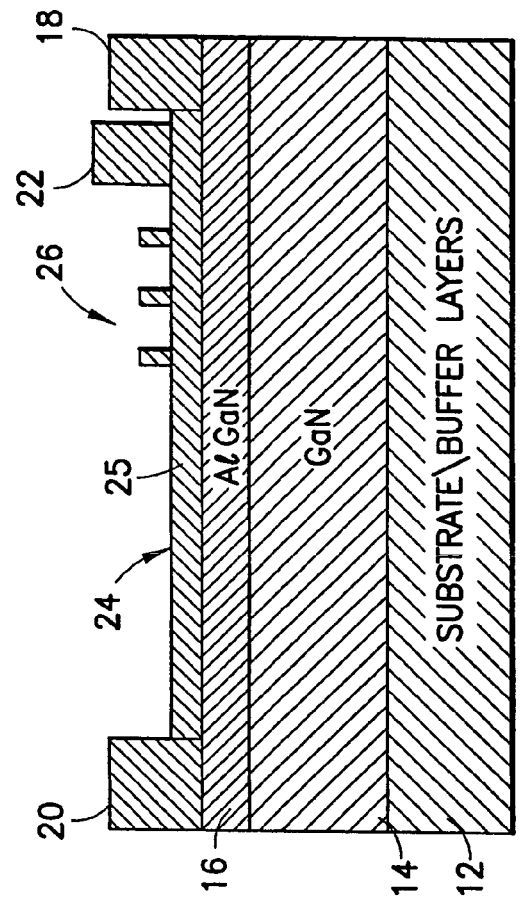
FIG. 4 shows a cross-sectional view of a device according to the second embodiment along line B-B viewed in the direction of the arrows.

Referring to FIGS. 1 and 2, a power semiconductor device according to the first embodiment of the present invention includes a III-nitride based heterojunction 10 disposed over a support body 12. Heterojunction 10 includes a first III-nitride semiconductor body 14, and a second III-nitride semiconductor body 16 over first III-nitride semiconductor body 14. A first power electrode 18 (i.e. source electrode) and a second power electrode 20 (i.e. drain electrode) are electrically connected to second III-nitride semiconductor body 16 through a direct ohmic connection or any other suitable means. A gate structure 22 is disposed between first power electrode 18 and second power electrode 20 over second III-nitride semiconductor body 14. In the preferred embodiment of the present invention, gate structure 22 includes a gate electrode which is connected to second III-nitride semiconductor layer 16 through a schottky contact. Alternatively, gate structure 22 may include a gate electrode, which is capacitively connected to second III-nitride semiconductor body through a gate insulation body. It should also be noted that gate structure 22 is disposed around first power electrode 18, and, thus can be operated to turn the channel between second power electrodes 20, 20' simultaneously.

According to one aspect of the present invention a field relaxation feature 24 is disposed over second III-nitride layer 16 adjacent gate structure 22 and between gate structure 22 and second power electrode 20. In the preferred embodiment of the present invention, field relaxation feature 24 is an ultra resistive field plate 25 formed with a highly electrically resistive material, such as, silicon rich SiN, compensated GaN or the like material.

In the first embodiment of the present invention, gate structure 22 is disposed on field plate 25 and second III-nitride semiconductor body 14. That is, field plate 25 extends beneath a portion of gate structure 22.

Figure 3:
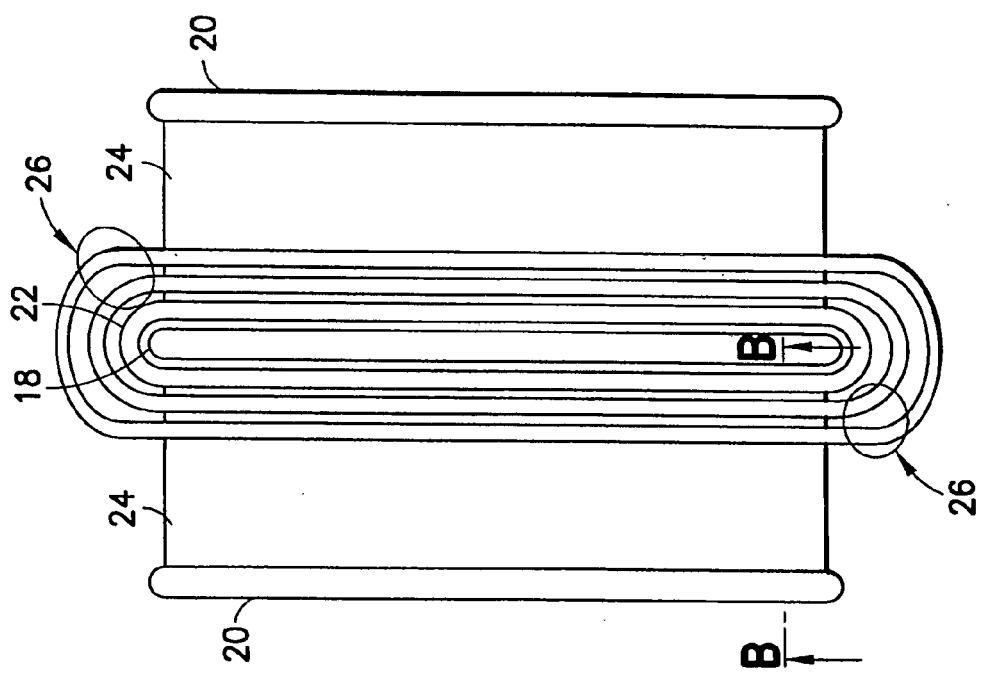
FIG. 3 shows a top plan view of two adjacently disposed active cells of a device according to the second embodiment of the present invention.

Referring to FIGS. 3 and 4, in a power semiconductor device according to the second embodiment of the present invention, gate structure 22 is disposed on field plate 25 only. A power semiconductor device according to the third embodiment of the present invention further includes a plurality of spaced guard rings 26 disposed between gate structure 22 and second power electrode 20. It should be noted that guard rings 26 are disposed around gate structure 22 (see FIG. 3).

Figure 5:
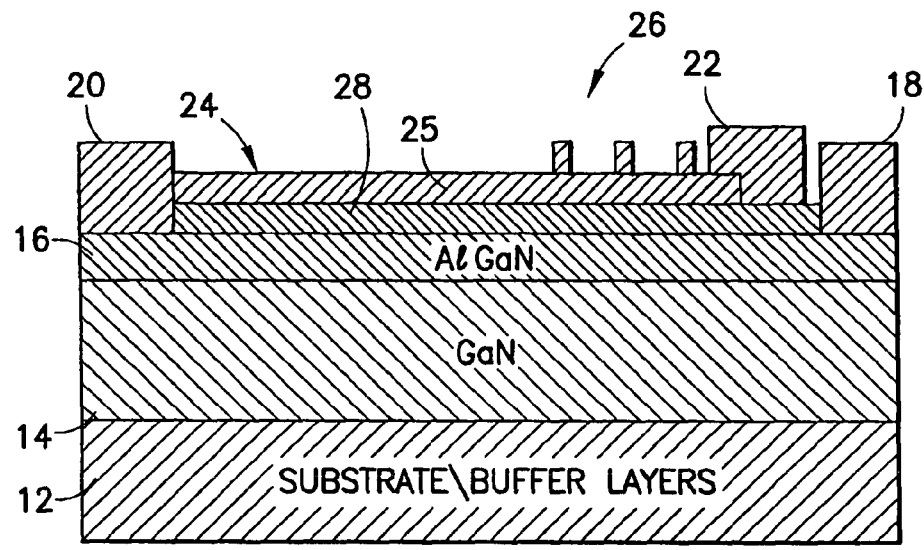
FIG. 5 shows a cross-sectional view of a device according to the third embodiment.

Referring next to FIG. 5, in a power semiconductor device according to the third embodiment of the present invention, a gate insulation body 28 is interposed between second III-nitride semiconductor body 16, and gate structure 22 and field relaxation feature 24. Note that in the third embodiment, gate structure 22 is a gate electrode which is capacitively connected to second III-nitride semiconductor body 16 through gate insulation 28.

Figure 6:
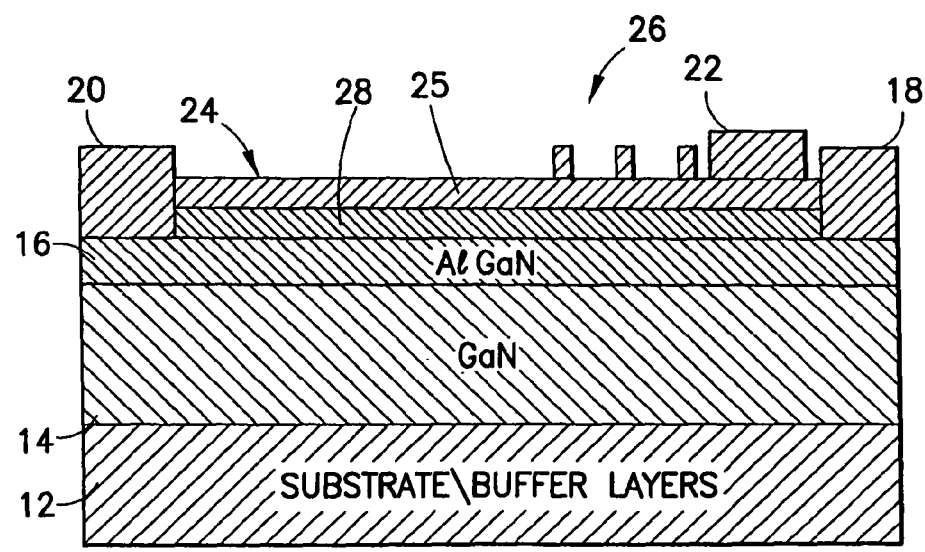
FIG. 6 shows a cross-sectional view of a device according to the fourth embodiment.

Referring to FIG. 6, in a power semiconductor device according to the fourth embodiment of the present invention gate insulation body 28 is interposed between field relaxation feature 24 and second III-nitride semiconductor body 16. Similar to the second embodiment, gate structure 22 is disposed on field plate 25 only, unlike the third embodiment in which gate structure 22 and field plate 25 are both disposed on gate insulation body 28. Similar to the third embodiment, gate structure 22 in the fourth embodiment is a gate electrode which is capacitively connected to second III-nitride semiconductor body 16 through field plate 24, and gate insulation body 28.

Figure 7:
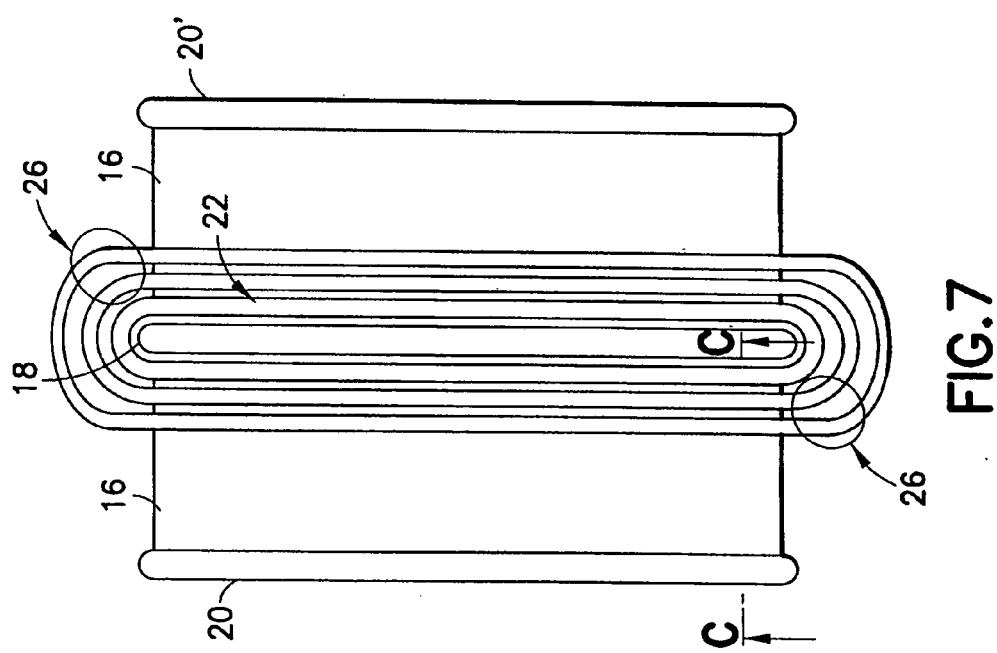
FIG. 7 shows a top plan view of two adjacently disposed active cells of a device according to the fifth embodiment of the present invention.
Figure 8:
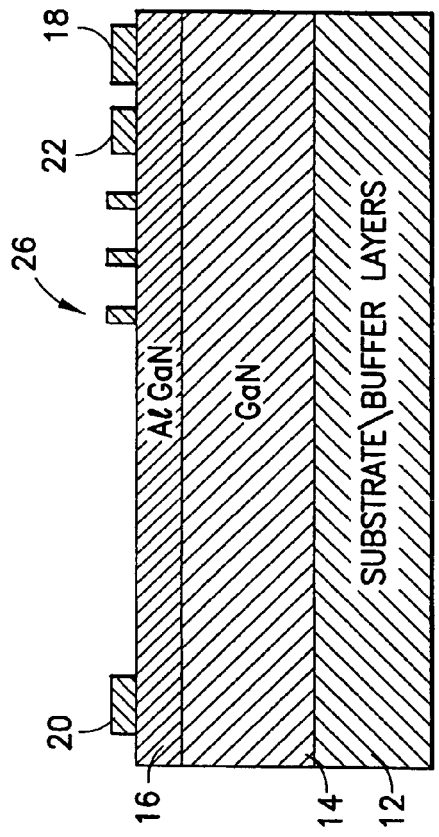
FIG. 8 shows a cross-sectional view of a device according to the fifth embodiment along line C-C viewed in the direction of the arrows.

Referring next to FIGS. 7 and 8, the field relaxation feature in a power semiconductor device according to the fifth embodiment is a plurality of spaced guard rings 26, which are disposed on second III-nitride semiconductor body 16 between gate structure 22, and second power electrode 20, and disposed around gate structure 22.

Figure 9:
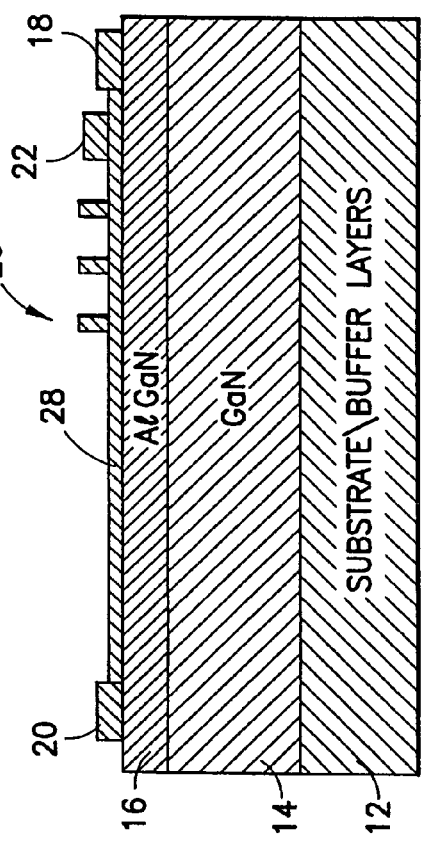
FIG. 9 shows a cross-sectional view of a device according to the sixth embodiment.

Referring to FIG. 9, in the sixth embodiment of the present invention, gate insulation body 28 is interposed between second III-nitride semiconductor body 16, guard rings 26 and gate structure 22.

Figure 10:
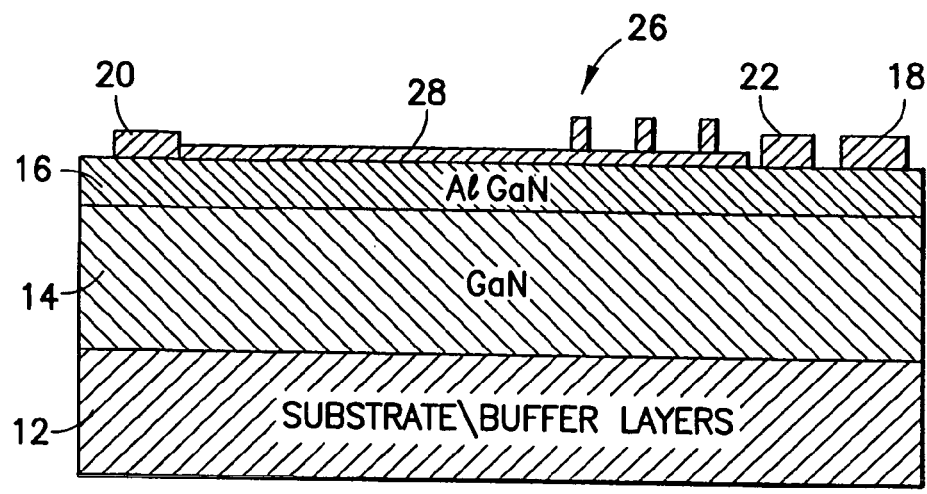
FIG. 10 shows a cross-sectional view of a device according to the seventh embodiment.

In the seventh embodiment of the present invention, as seen in FIG. 10, gate structure 22 is disposed on second III-nitride semiconductor body 16, while guard rings 26 are disposed on gate insulation body 28. Thus, unlike the fifth and sixth embodiments, guard rings 26 and gate structure 22 are not coplanar. Preferably, gate structure 22 includes a gate electrode which is electrically connected to second III-nitride semiconductor body 16 through a schottky connection.

Figure 11:
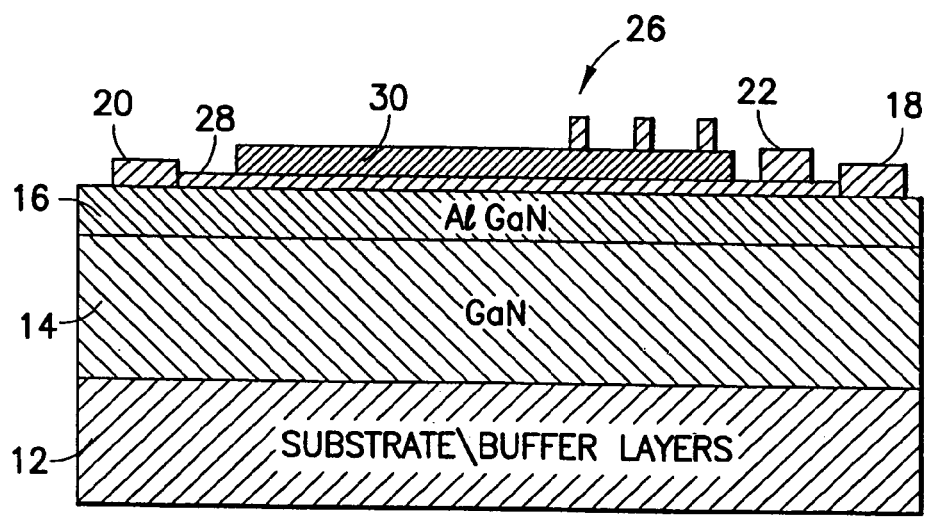
FIG. 11 shows a cross-sectional view of a device according to the eighth embodiment.

Referring next to FIG. 11, a power semiconductor device according to the eighth embodiment includes all the features of the sixth embodiment (FIG. 9) and further includes a field insulation body 30 interposed between gate insulation body 28 and guard rings 26. Thus, similar to the seventh embodiment (FIG. 10), guard rings 26 and gate structure 22 are not coplanar.

Figure 12:
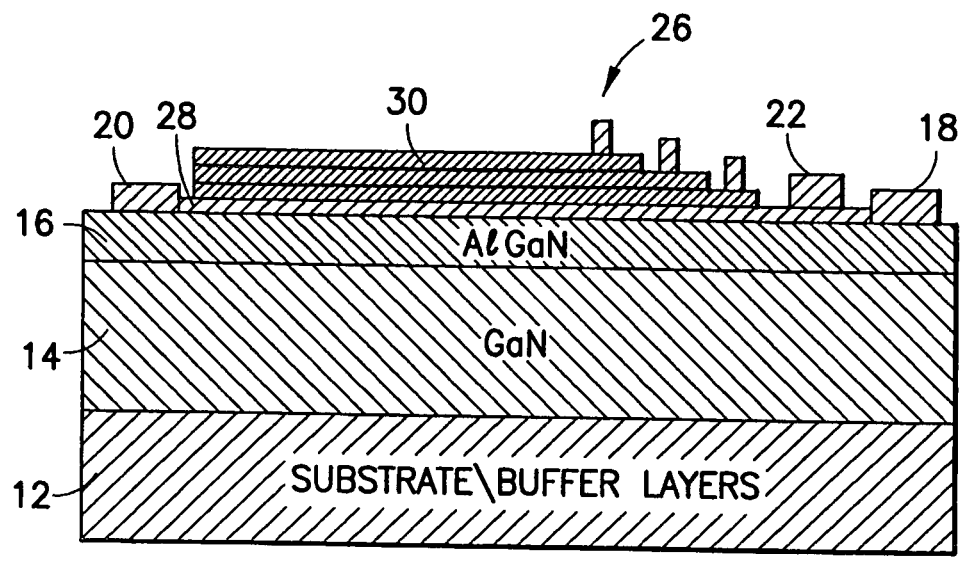
FIG. 12 shows a cross-sectional view of a device according to the ninth embodiment.

Referring next to FIG. 12, a device according to the ninth embodiment of the present invention includes all of the features of the eighth embodiment except that field insulation 30 in the ninth embodiment beneath guard rings 26 is stepped thereby rendering guard rings 26 non-coplanar. That is, unlike guard rings 26 in the eighth embodiment, guard rings 26 in the ninth embodiment are not coplanar.

In the embodiments discussed above, guard rings 26 are independently floating. That is, guard rings 26 are not referenced to another potential, but are each floating.

Figure 13:
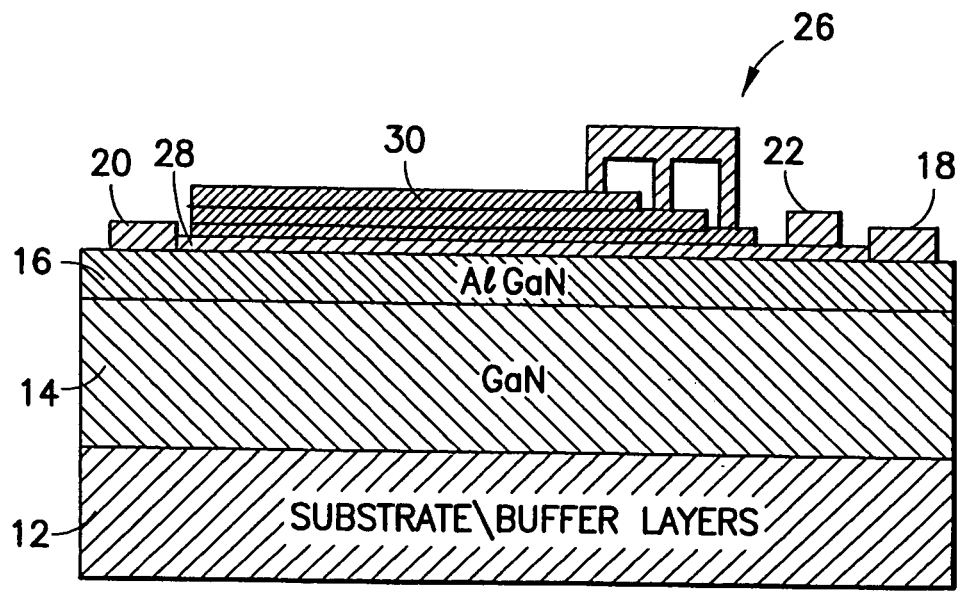
FIG. 13 shows a cross-sectional view of a device according to the tenth embodiment.

Referring to FIG. 13, in a device according to the tenth embodiment, guard rings 26 are shorted to one another, whereby all guard rings 26 are referenced to and floating at the same potential, rather than being independently floating.

Figure 14:
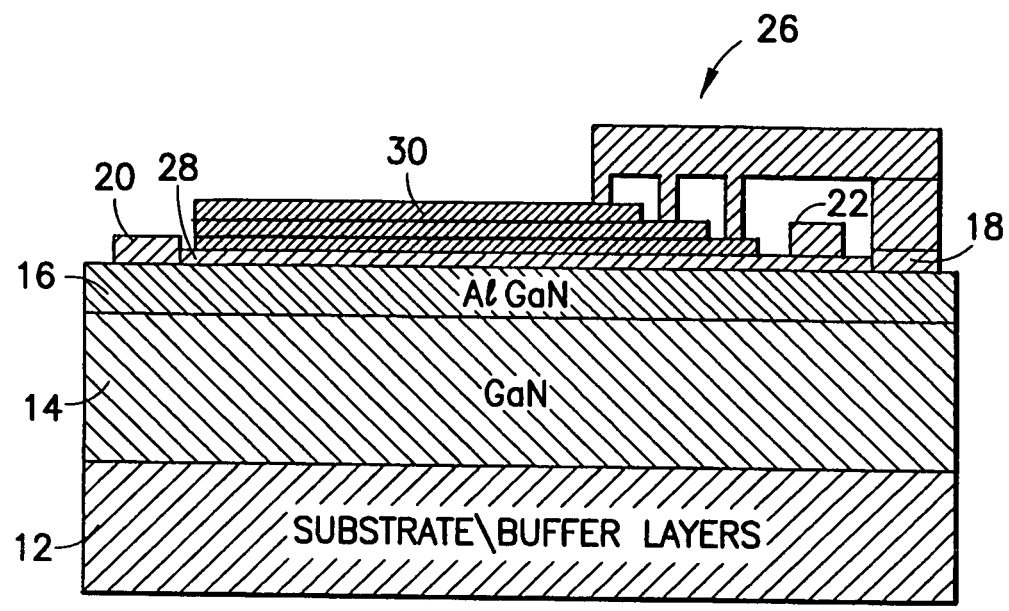
FIG. 14 shows a cross-sectional view of a device according to the eleventh embodiment.

Referring to FIG. 14, in a device according to the eleventh embodiment of the present invention, guard rings 26 can be shorted to one another and shorted to first power electrode 18. Thus, guard rings 26 can be referenced to the potential of first power electrode 18.

Figure 15:
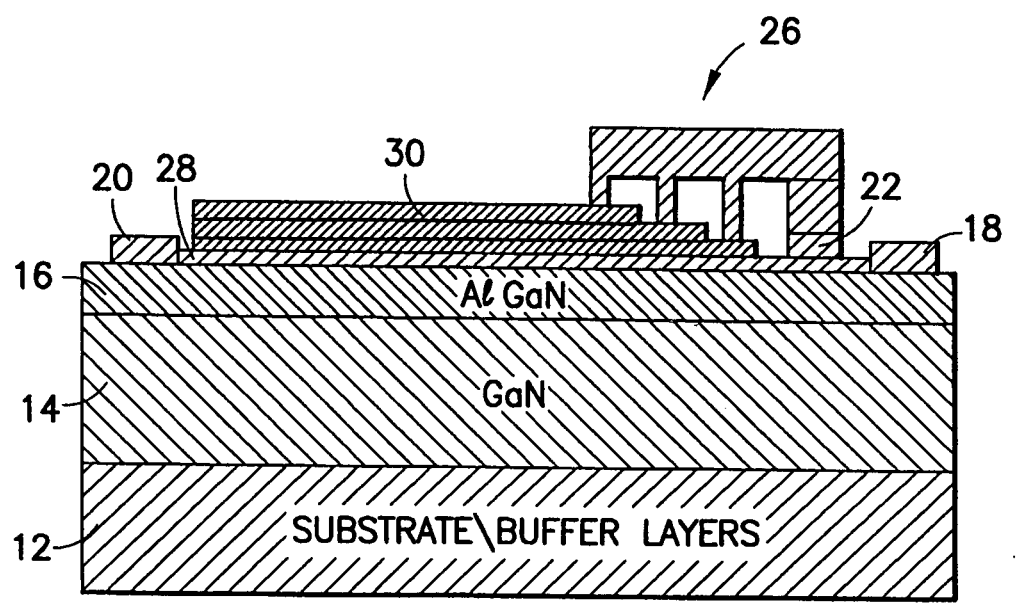
FIG. 15 shows a cross-sectional view of a device according to the twelfth embodiment.

Referring next to FIG. 15, in a device according to the twelfth embodiment of the present invention, guard rings 26 are shorted to one another, and shorted to gate structure 22. Thus, guard rings 26 are referenced to the same potential as gate structure 22.

In a device according to any one of the embodiments of the present invention, first III-nitride semiconductor body is an alloy from the InAlGaN system, such as GaN, and second III-nitride semiconductor body 16 is another alloy from the InAlGaN system having a band gap that is different from that of first III-nitride semiconductor 14, whereby a two-dimensional electron gas is formed due to the heterojunction of the first and the second III-nitride semiconductor bodies as is well known in the art. For example, second III-nitride semiconductor body may be formed with AlGaN.

In addition, support body 12 is a combination of a substrate material and if required a buffer layer on the substrate to compensate for the lattice and thermal mismatch between the substrate and first III-nitride semiconductor body 14. For economic reasons, the preferred material for the substrate is silicon. Other substrate materials such as sapphire, and SiC can also be used without deviating from the scope and the spirit of the present invention.

AlN is a preferred material for a buffer layer. However, a multi-layer or graded transitional III-nitride semiconductor body may also be used as a buffer layer without deviating from the scope and the spirit of the present invention.

It is also possible to have the substrate made from the same material as first III-nitride semiconductor body and thus avoid the need for a buffer layer. For example, a GaN substrate may be used when first III-nitride semiconductor body 14 is formed with GaN.

The gate electrode may be composed of n type or p type silicon, or polysilicon of any desired conductivity, and may further include an aluminum, Ti/Al, or other metallic layer over the top surface thereof. Ohmic electrodes may be composed of Ti/Al and may further include other metallic bodies over the top surface thereof such as Ti/TiW, Ni/Au, Mo/Au, or the like. Gate insulation body 28 may be composed of SiN, $Al_2O_3$, $SiO_2$, HfO, MgO, $Sc_2O_3$, or the like. Field insulation body 30 may be composed of $SiO_2$, SiN, $Al_2O_3$, HfO, MgO, $Sc_2O_3$, or the like. Guard rings 26 are preferably made of the same material as that used for the gate electrode to allow for single step fabrication of the gate electrode and guard rings 26.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device, comprising:
   a III-nitride based heterojunction including a first III-nitride layer having a band gap, and a second III-nitride layer having another band gap over said first III-nitride layer;
   a source electrode electrically connected to and disposed over said second III-nitride layer;
   a first drain electrode and a second drain electrode electrically connected to said second III-nitride layer;
   a gate structure including a single gate electrode having two spaced parallel portions and two curved connecting portions connecting said two spaced parallel portions, said single gate electrode surrounding said source electrode, said source electrode and said gate structure situated between said first drain electrode and said second drain electrode; and
   a field relaxation feature disposed over said second III-nitride layer adjacent said gate structure,
   wherein said field relaxation feature includes an ultra resistive field plate comprised of a semiconductor,
   wherein said gate structure is in direct contact with both of said second III-nitride layer and said ultra resistive field plate,
   wherein said ultra resistive field plate contacts said first drain electrode and said second drain electrode, extends inward from said first drain electrode and said second drain electrode to said gate structure and terminates at said gate structure such that said ultra resistive field plate is spaced apart from said source electrode.

2. The power semiconductor device of claim 1, wherein said gate structure is disposed on said field plate and said second III-nitride layer.

3. The power semiconductor device of claim 1, wherein said gate structure is disposed on said field plate.

4. The power semiconductor device of claim 1, wherein said field plate is comprised of silicon rich SiN.

5. The power semiconductor device of claim 1, wherein said field plate is comprised of a compensated III-nitride semiconductor.

6. The power semiconductor device of claim 1, further comprising a plurality of floating field rings disposed over said field plate.

7. The power semiconductor device of claim 1, wherein said first III-nitride layer is comprised of GaN and said second III-nitride layer is comprised of AlGaN.

8. The power semiconductor device of claim 1, further comprising a base that includes a substrate, and a buffer layer disposed over said substrate and under said first III-nitride layer.

9. The power semiconductor device of claim 1, wherein said gate structure includes a gate insulation body.

10. The power semiconductor device of claim 9, wherein said gate insulation body is disposed between said field plate and said second III-nitride layer.

11. The power semiconductor device of claim 10, further comprising a plurality of floating field rings disposed over said field plate.

12. A power semiconductor device, comprising:
   a III-nitride based heterojunction including a first III-nitride layer having a band gap, and a second III-nitride layer having another band gap over said first III-nitride layer;
   a source electrode electrically connected to said second III-nitride layer;
   a first drain electrode and a second drain electrode electrically connected to said second III-nitride layer;
   a gate structure including a gate insulation body and a single gate electrode having two spaced parallel portions and two curved connecting portions connecting said two spaced parallel portions over said gate insulation body, said single gate electrode surrounding said source electrode, said source electrode and said gate structure situated between said first drain electrode and said second drain electrode; and
   a field relaxation feature disposed over said second III-nitride layer adjacent said gate structure, wherein said field relaxation feature includes an ultra resistive field plate and a plurality of spaced and floating guard rings surrounding said single gate electrode and over said gate insulation body,
   wherein said ultra resistive field plate is in direct contact with both of said gate insulation body and said single gate electrode,
   wherein said ultra resistive field plate contacts said first drain electrode and said second drain electrode, extends inward from said first drain electrode and said second drain electrode to said gate structure and terminates at said gate structure such that said ultra resistive field plate is spaced apart from said source electrode.

13. The power semiconductor device of claim 12, wherein said guard rings are disposed over said second III-nitride layer.

14. The power semiconductor device of claim 12, wherein said guard rings are disposed on said ultra resistive field plate.

15. The power semiconductor device of claim 14, wherein said ultra resistive field plate is disposed over said gate insulation body.

16. The power semiconductor device of claim 15, wherein said guard rings are coplanar.

17. The power semiconductor device of claim 15, wherein said guard rings are coplanar.

18. The power semiconductor device of claim 12, wherein said guard rings are coplanar.

19. The power semiconductor device of claim 12, wherein said guard rings are non-coplanar.

20. The power semiconductor device of claim 12, wherein said first III-nitride layer is comprised of GaN and said second III-nitride is comprised of AlGaN.

21. The power semiconductor device of claim 12, further comprising a base that includes a substrate, and a buffer layer disposed over said rate and under said first III-nitride layer.

22. The power semiconductor device of claim 12, wherein said floating guard rings are shorted to one another.

23. A power semiconductor device, comprising:
   a III-nitride based heterojunction including a first III-nitride layer having a band gap, and a second III-nitride layer having another band gap over said first III-nitride layer;
   a source electrode electrically connected to said second III-nitride layer;
   a first drain electrode and a second drain electrode electrically connected to said second III-nitride layer;

a gate structure including a gate insulation body and a single gate electrode having two spaced parallel portions and two curved connecting portions connecting said two spaced parallel portions over said gate insulation body, said single gate electrode surrounding said source electrode, said source electrode and said gate structure situated between said first drain electrode and said second drain electrode; and a field relaxation feature disposed over said second III-nitride layer adjacent said gate structure, wherein said field relaxation feature includes a plurality of stepped field insulation bodies and a plurality of guard rings with one of said plurality of guard rings on each of said plurality of stepped field insulation bodies, said plurality of guard rings are shorted to said source electrode or shorted to said single gate electrode and over said gate insulation body.

* * * * *